United States Patent [19]

Kerbow

[11] Patent Number: 4,629,756

[45] Date of Patent: Dec. 16, 1986

[54] HEAT REFLECTIVE POLYMER BLENDS

[75] Inventor: Dewey L. Kerbow, Vienna, W. Va.

[73] Assignee: E. I. Du Pont de Nemours and Company, Wilmington, Del.

[21] Appl. No.: 794,398

[22] Filed: Nov. 4, 1985

[51] Int. Cl.$^4$ .............................................. C08K 3/08
[52] U.S. Cl. ................................. 524/440; 524/546; 252/512
[58] Field of Search ............... 524/440; 252/503, 512, 252/511

[56] References Cited

U.S. PATENT DOCUMENTS

| | | | |
|---|---|---|---|
| 3,983,075 | 9/1976 | Marshall et al. | 523/459 |
| 4,123,401 | 10/1978 | Berghmans et al. | 523/210 |
| 4,166,146 | 8/1979 | Köos | 428/315 |
| 4,305,847 | 12/1981 | Stoetzer et al. | 524/440 |
| 4,474,685 | 10/1984 | Annis | 524/440 |
| 4,484,400 | 11/1984 | Lehrman | 428/328 |
| 4,545,926 | 10/1985 | Fouts et al. | 252/503 |
| 4,566,990 | 1/1986 | Liu et al. | 524/440 |

FOREIGN PATENT DOCUMENTS 5925833  8/1982  Japan.

OTHER PUBLICATIONS

Modern Plastics Encyclopedia, vol. 61, No. 10A, 1980-1985, pp. 558 and 562.
Derwent Abstract 83-755918/36, J58127743 (Jul. 1983) Aron Kasei.
Derwent Abst. 83-755919/36, J58127744 (Jul. 1983), Aron Kasei.
Derwent Abst. 84-033141/06, J58222124 (12-83), Aron.

*Primary Examiner*—Herbert J. Lilling

[57] ABSTRACT

A radiant heat reflective composition comprising a blend of a tetrafluoroethylene copolymer and copper flake.

7 Claims, No Drawings

HEAT REFLECTIVE POLYMER BLENDS

BACKGROUND OF THE INVENTION

Many polymers are useful as protective shielding for various purposes, such as for abrasion resistance, chemical resistance or heat resistance. The polymers can take the form of a coating, film, or tube, or the like. In such instances, it is frequently beneficial to incorporate additives to enhance specific shielding performance. For example, in Japanese laid-open publication 59-25833 certain flake or platelet additives coated with polyamide acids are incorporated into certain fluorine-containing polymers to enhance abrasion resistance and compression resistance. In addition, aluminum flake is used in various thermoplastics to shield semiconductor components from electromagnetic impulse, as seen by Modern Plastics Encyclopedia 1984–1985, pages 558 and 562.

With the increased use of thermoplastic polymers in high temperature applications such as automotive engine equipment where temperatures reach 125° C. or more, it is desirable to develop thermoplastic polymers having improved shielding, or radiant heat reflectivity.

SUMMARY OF THE INVENTION

This invention concerns a radiant heat reflective composition comprising a blend of a thermoplastic tetrafluoroethylene copolymer and copper flake.

DETAILED DESCRIPTION OF THE INVENTION

The polymers useful herein are of film forming molecular weight. If the polymer is amorphous, it must have a glass transition temperature above 150° C., and if it is partially crystalline it must have a melting point above 200° C. By partially crystalline is meant that the polymer has a distinct endotherm as determined Differential Scanning Calorimetry. An amorphous polymer has no distinct endotherm.

Representative tetrafluoroethylene copolymers include copolymers containing tetrafluoroethylene, chlorotrifluoroethylene or vinylidene fluoride. One or more comonomers can be present and such comonomers include: olefins of 2–8 carbons, such as ethylene; perfluoroalkylenes of 3–8 carbons, such as hexafluoropropylene; perfluoro(alkyl vinyl ethers) of 3–8 carbons such as perfluoro(propylvinyl ether); perfluoroalkyl ethylenes of 3–8 carbons, such as perfluorobutyl ethylene, and the like. Representative polymers include tetrafluoroethylene/hexafluoropropylene, tetrafluoroethylene/perfluoro(propyl vinyl ether), tetrafluoroethylene/perfluorobutyl ethylene, ethylene/tetrafluoroethylene co- and ter- polymers, and the like.

For some applications, the polymers should have a good degree of resistance to thermal decomposition, oxidation, and hydrolysis. In some of the polymers that meet the melting point/glass transition temperature requirements herein, it is conventional to include antioxidants or to have the end groups stabilized against thermal degradation.

The copper flake used herein can be any flake of copper metal that has a number average particle size of 2–250 micrometers, preferably 3–50 micrometers, and an aspect ratio of 4:1 to 100:1, preferably 20:1 to 40:1. The copper flake will be present in an amount 0.5 to 10 percent by weight (preferably 1–6%) based on weight of polymer and copper flake. The flakes must have a large aspect ratio (ratio of particle size to thickness) and have a particle size which allows good dispersion in the polymer matrix for substantially complete block-out of light (i.e., no holes between the individual flakes to allow light to penetrate). Small particles (less than the wavelength of infrared radiation) have been found to be ineffective. Large particles are not desirable since they do not orient themselves properly in the formed article and will allow light to pass between the individual particles.

To make blends of the heat reflective composition, the polymer and the flake are simply mixed together in any suitable fashion. Conveniently, the components are simply tumbled together. Alternatively, they may be stirred. On extrusion to make pellets or molded articles, the flake becomes substantially aligned, or oriented, in one plane to provide an effective barrier to heat penetration.

The amount of flake present depends on the degree of shielding wanted and on the particle size. The most effective heat reflectance will be achieved when the flakes overlap one another.

Copper has an additional benefit in that copper compounds are known to be effective oxidative stabilizers for certain polymers such as ETFE (ethylene/tetrafluoroethylene) copolymers.

Titanium dioxide, zirconium dioxide and other opaque, high-refractive index materials have proven ineffective as reflectors of infrared radiation. Materials with high refractive indices but which absorb infrared radiation, such as iron oxide ($Fe_2O_3$), become hot themselves, thus defeating the objective of this invention.

The compositions can be shaped into articles such as film, tubing or moldings which can provide lightweight, flexible protection for heat-sensitive materials subjected to heat and infrared radiation. Fabrication advantages are realized over the traditional technique of metallizing or otherwise treating molded or extruded parts to provide reflectivity.

TEST PROCEDURES

Melting points of partially crystalline polymers useful herein can be determined by Differential Scanning Calorimetry, using the minimum point on the curve as the melting point (heating rate of 10° C. per min.).

Glass transition temperatures of amorphous polymers useful herein can be determined by ASTM D3418-75.

Particle size and aspect ratio of the copper flake can be determined by taking an electron microscope picture and performing statistical analysis to obtain the number average values.

Radiant Energy Reflectivity is determined by molding a flat sheet, 0.25 mm thick and 10 cm square, of the material to be tested using a heated platen press at 30°–40° C. above the melting point of the composition and placing the blend to be molded in the center of the square. A thermocouple is attached to one side of the sheet using heat resistant fiberglass adhesive tape. The thermocouple is placed in the center of any one of the four quadrants of the square. A second thermocouple is molded into a 1.27 cm diameter, 3.2 mm thick section of low density polyethylene, such that the thermocouple bead is at the surface of the molding. This thermocouple/molding is attached with fiberglass tape to the opposite side of the sample in the same quadrant almost in the center but in such a manner that the other thermocouple or attaching tape does not block it, and such that the embedded thermocouple is against the sample surface. The thermocouple should be connected to an appropriate readout device or potentiometer to indicate temperature in ° C. The purpose of the polyethylene molding is to simulate a heat-sensitive material which is to be shielded by the sample.

The sample is mounted vertically, 30.5 cm from the quartz elements of a Presto 1500 watt twin-tube quartz heater. The side with the bare thermocouple faces the heater and is called herein the front side. The other side is referred to hereinafter as the back side. The heater is turned on high and a timer started. Both front and back temperatures are read after five minutes of heating.

EXAMPLES

Example 1

2160 gm of a polymer of ethylene/tetrafluoroethylene/perfluorobutyl ethylene [E/TFE/PFBE, about 49/48/3 mole %, melt viscosity $11.9 \times 10^4$ poise measured at 297° C. at a shear stress of 44.8 kPA (indicating a film-forming molecular weight), melting point of about 265° C. measured by DSC], prepared by the nonaqueous polymerization procedure described in U.S. Pat. No. 3,528,954, was mixed with extra fine copper flake (114 grams, grade #1400-U, Atlantic Powdered Metals, Inc.) and the mixture tumbled to produce an intimate blend. The blend was melt-extruded at 290-300 degrees Centigrade and the extrudate chopped to produce pellets. The result was a resin containing 5.0 percent copper flake by weight based on weight of polymer and flake.

The extruded blend was tested by the Radiant Energy Reflectivity test described above. A temperature of 95° C. was reached on the side of the sheet away from the radiant heat source (the back side), and a temperature of 127° C. was reached on the front side.

Example 2

As in Example 1, the E/TFE/PFBE polymer fluff and the #1400-U copper flake were blended. But the mixture was not extruded. The fluff blend was molded as described in Example 1 and tested by the Radiant Energy Reflectivity test. Front side temperature was 127° C., and back side temperature was 99° C.

Comparison A

The E/TFE/PFBE fluoropolymer used in Examples 1 and 2 was tested by the Radiant Energy Reflectivity test without any copper flake present. A temperature of 119° C. was reached the front side of the sheet, and 118° C. was measured on the back side of the sheet.

Thus the copolymer, in the absence of copper flake, has virtually no infrared reflectance capacity.

Example 3

Larger particle size copper flake was used.

As in example 1, a blend of 5 percent by weight of copper flake (25 micron average particle size, aspect ratio =5:1, grade MD-3700, MD-Both Corporation) in the copolymer of Example 1 was prepared and molded into a 0.25 mm sheet. The Radiant Energy Resistivity test recorded 101° C. on the side away from the radiation (the back side), and 119° C. on the front side.

Data on additives and a summary of the results in Examples 1-3 and the Comparison is shown in the following table:

| Example | Additive | Avg. Part Size (micrometers) | Aspect Ratio | Temp Front | Temp Back | Temp. difference between front and back |
|---|---|---|---|---|---|---|
| 1 | Copper-5% 1400-U | 5 | 30:1 | 127 | 95 | 32 |
| 2 | Copper-5% 1400-U | 5 | 30:1 | 127 | 99 | 28 |
| A | None | — | — | 119 | 118 | 1 |
| 3 | Copper-5% MD-3700 | 25 | 5:1 | 119 | 101 | 18 |

I claim:
1. A composition comprising
   (a) a thermoplastic tetrafluoroethylene copolymer of film-forming molecular weight and
   (b) 0.5 to 10 percent by weight, based on weight of copolymer and copper flake, of copper flake having a number average particle size of between 2 and 250 micrometers and an aspect ratio greater than 4:1.
2. The composition of claim 1 in which the average number particle size of the copper flake is between 4 and 50 microns.
3. The composition of claim 1 which the aspect ratio of the copper is between 20:1 and 40:1.
4. The composition of claim 3 in which the aspect ratio of the copper is between 20:1 and 40:1.
5. The composition of claim 1 wherein the tetrafluoroethylene copolymer contains units of ethylene.
6. The composition of claim 1 wherein the amount of b) present is between 1 and 6%.
7. A composition of claim 1 in the form of an extruded or molded article.

* * * * *